United States Patent [19]
Tanitsu

[11] Patent Number: 5,912,725
[45] Date of Patent: Jun. 15, 1999

[54] ILLUMINATION OPTICAL SYSTEM TO BE USED IN AN EXPOSURE APPARATUS AND A METHOD OF MANUFACTURING A SEMICONDUCTOR STRUCTURE USING THE EXPOSURE APPARATUS

[75] Inventor: Osamu Tanitsu, Funabashi, Japan

[73] Assignee: Nikon Corporation, Tokyo, Japan

[21] Appl. No.: 08/667,606

[22] Filed: Jun. 21, 1996

[30] Foreign Application Priority Data

Jun. 23, 1995 [JP] Japan ................................ 7-157812

[51] Int. Cl.⁶ .......................... G03B 27/42; G03B 27/52
[52] U.S. Cl. .................... 355/53; 355/55; 355/67
[58] Field of Search ................. 355/67–71, 53, 355/64; 359/619, 622, 620, 355; 362/268

[56] References Cited

U.S. PATENT DOCUMENTS

| | | | |
|---|---|---|---|
| Re. 34,634 | 6/1994 | Konno et al. | 355/67 |
| 4,497,015 | 1/1985 | Konno et al. | 362/268 |
| 4,870,452 | 9/1989 | Tanimoto et al. | 355/53 |
| 4,905,041 | 2/1990 | Aketagawa | 355/53 |
| 5,170,207 | 12/1992 | Tezuka et al. | 355/53 |
| 5,237,367 | 8/1993 | Kudo | 355/67 |
| 5,245,384 | 9/1993 | Mori | 355/67 |
| 5,448,336 | 9/1995 | Shiraishi | 355/71 |
| 5,534,970 | 7/1996 | Nakashima et al. | 355/53 |
| 5,636,003 | 6/1997 | Tanitsu et al. | 355/67 |
| 5,699,183 | 12/1997 | Hiraiwa et al. | 359/355 |

*Primary Examiner*—Richard Moses
*Assistant Examiner*—Shival Virmani
*Attorney, Agent, or Firm*—Foley & Lardner

[57] ABSTRACT

An exposure apparatus comprises a light source for supplying light with a predetermined wavelength and an illumination optical system for guiding the light from this light source onto a mask formed with a predetermined pattern. The illumination optical system includes a plurality of light-transmitting optical members which transmit therethrough the light from the light source, while at least one of the plurality of light-transmitting optical members is comprised of fluorite. Even when the mask is irradiated with exposure light for a long period, the optical members in the illumination optical system can be prevented from deteriorating, whereby a stable exposure operation can be realized over a long period.

62 Claims, 3 Drawing Sheets

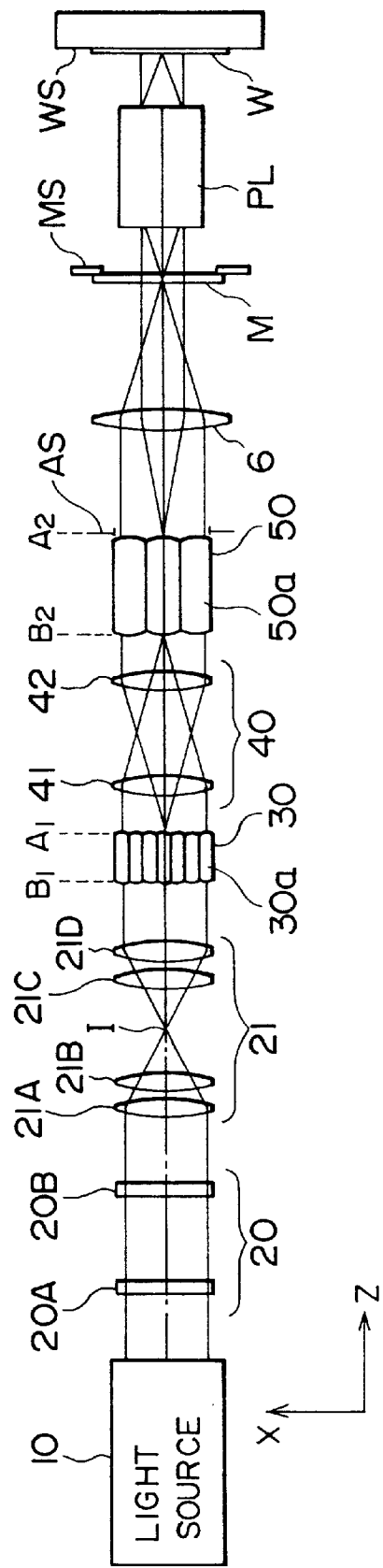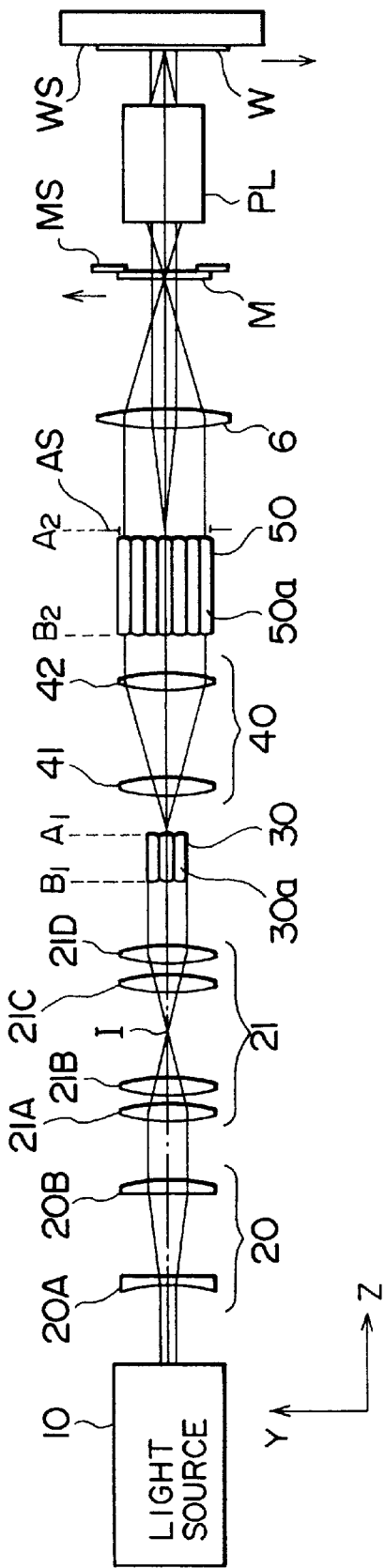

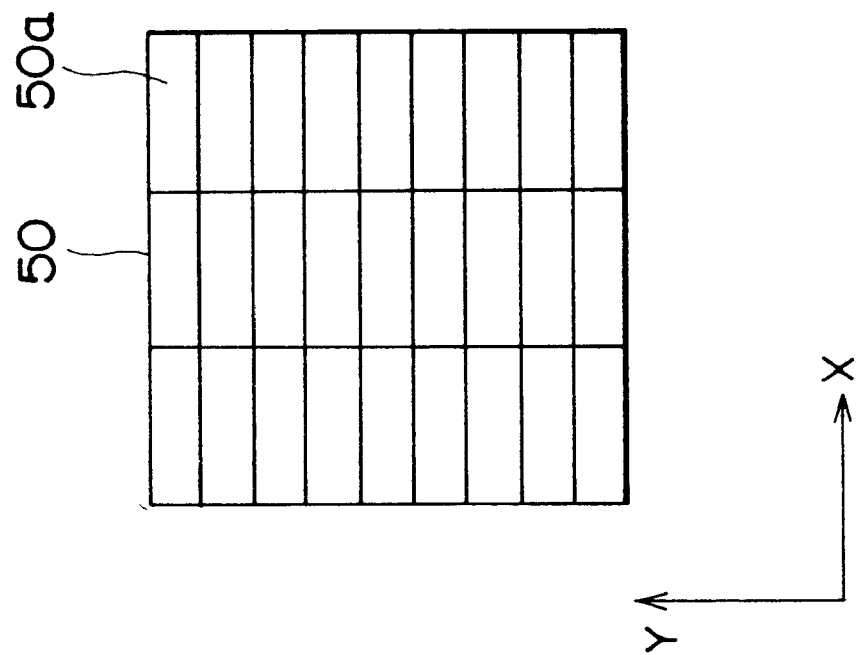
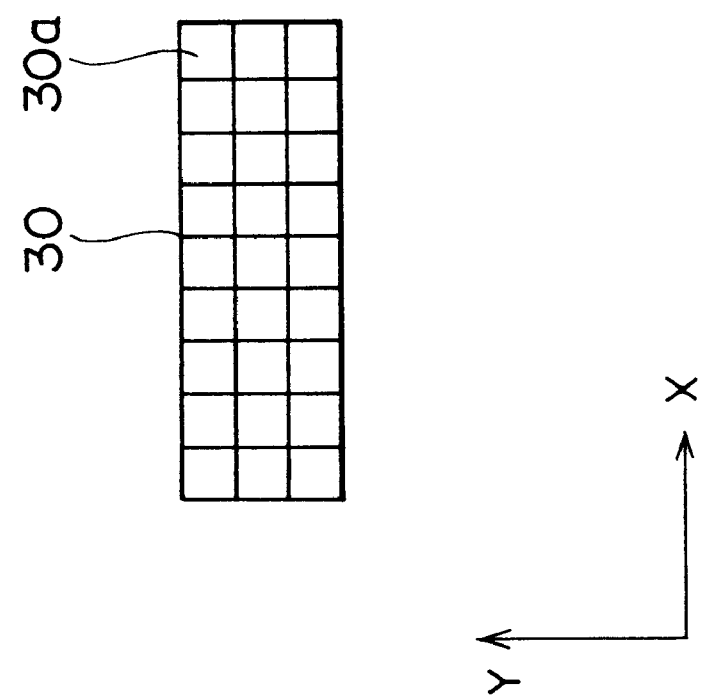

ILLUMINATION OPTICAL SYSTEM TO BE USED IN AN EXPOSURE APPARATUS AND A METHOD OF MANUFACTURING A SEMICONDUCTOR STRUCTURE USING THE EXPOSURE APPARATUS

BACKGROUND OF THE INVENTION

1. Field of the Invention

The present invention relates to an exposure apparatus which transfers a predetermined mask pattern onto a photosensitive substrate and, in particular, to an exposure apparatus using an ultraviolet light source suitable for manufacturing semiconductors.

2. Related Background Art

Conventionally, an exposure apparatus such as that schematically shown in FIG. 3A has been known for making semiconductors. As shown in FIG. 3A, a luminous flux from a light source 1 such as a mercury arc lamp is converged by an ellipsoidal mirror 2 and then converted into a parallel luminous flux by a collimator lens 3. The parallel luminous flux then passes through a flyeye lens 4 composed of an assembly of lens elements 4a each having a quadrangular cross section as shown in FIG. 3B or 3C, thereby forming a plurality of light source images on its exit side. An aperture stop 5 having a circular opening is disposed at this light source image position. The luminous fluxes from the plurality of light source images are converged by a condenser lens 6 so as to uniformly illuminate a mask M, which is an object to be illuminated, in a superposing manner.

In the illumination optical apparatus thus configured, by means of a projection optical system 7 composed of lenses 71 and 72, a circuit pattern on the mask M is transferred onto a wafer W which is coated with a resist. This wafer W is mounted on a wafer stage WS which is two-dimensionally movable. The exposure apparatus of FIG. 3A performs a so-called step-and-repeat type exposure operation in which, when an exposure operation for one shot area is completed, the wafer stage WS is successively moved in a two-dimensional manner so as to be repositioned for an exposure operation for the next shot area.

Also, in recent years, there has been proposed a scanning exposure technique in which the mask M is irradiated with a rectangular or arc-like luminous flux, while the mask M and the wafer W which are disposed so as to be conjugate with each other with respect to a projection optical system are scanned in a predetermined direction, in order to transfer the circuit pattern of the mask M onto the wafer W under a high throughput.

In recent years, the output wavelength of the exposure light source has been shortened in order to transfer a finer mask pattern onto the wafer surface. For example, in a so-called projection type exposure apparatus which transfers, by way of a projection optical system, a mask pattern onto a wafer coated with a resist, the resolution of the projection optical system can be improved as the output wavelength of the exposure light source becomes shorter.

When a light source which outputs exposure light of a shorter wavelength such as a pulse light source emitting ultraviolet rays is used, since the wavelength of the emitted light is in the ultraviolet region, quartz glass is used in general as an optical glass material (referred to as "glass material" hereinafter) for transmitting the ultraviolet rays therethrough because it can be processed as easily as materials which can transmit visible rays therethrough.

However, light sources emitting ultraviolet rays such as pulse oscillation light sources for ultraviolet rays have a high output. In particular, in an illumination optical system for an exposure apparatus which guides a luminous flux from such a light source to a mask, there is a position where the diameter of the luminous flux becomes small thereby increasing the energy density at this position such that considerable damage may be imparted to the quartz glass of the illumination optical system. As the wavelength of the light source becomes shorter, the energy further increases so as to cause a greater damage to the quartz glass. Accordingly, the durability of the quartz glass may be problematic.

Also, there has been a demand for increasing the number of substrates such as wafer which are processed per hour in the exposure apparatus for improving the throughput thereof. The power of the light source may be raised in order to effectively increase the illuminance on a substrate such as a wafer, however a higher energy density is therefore imparted to the quartz glass placed at a position where the diameter of the luminous flux is minimized. Accordingly, the durability of the quartz glass may become further problematic.

SUMMARY OF THE INVENTION

In view of the foregoing, the object of the present invention is to provide an exposure apparatus which can prevent optical members in its illumination optical system from deteriorating even when irradiating a mask with exposure light for a long period, so that a stable exposure operation can be realized over a long period.

The exposure apparatus in accordance with the present invention comprises a light source for supplying light with a predetermined wavelength and an illumination optical system for guiding the light from the light source onto a mask formed with a predetermined pattern. The illumination optical system includes a plurality of light-transmitting optical members which transmit therethrough the light from the light source, while at least one of the plurality of light-transmitting optical members is comprised of fluorite.

In the present invention, because a physical property of fluorite is that it has a high durability with respect to a high energy density, it has been found that, according to the configuration mentioned above, optical members in the illumination optical system can be prevented from deteriorating even when the mask is irradiated with exposure light for a long period, whereby a stable exposure operation can be realized over a long period.

In particular, in conjunction with a technique for determining fluorite as a member to be used in the illumination optical system of the exposure apparatus, the energy density of a luminous flux irradiating an optical member may be calculated beforehand at the step in which the illumination optical system is designed according to this technique, since the energy density of the luminous flux irradiating the optical member can be determined by the ratio of its area to that of the original luminous flux from the light source. In this case, the fluorite is desirably subjected to an irradiation test beforehand so as to determine its durability. More desirably, based on the result of the prior calculation and the assumption of the total irradiation time, the illumination optical system may be designed such that fluorite is used at a position where the energy density is high.

In view of the foregoing, as a result of various kinds of simulation and various kinds of tests using light sources supplying pulsed light, the inventor has found that, in an illumination optical system, an optical member disposed at a position at which the cross-sectional area of the luminous flux transmitted therethrough satisfies the following relationship is preferably comprised of fluorite:

$$A_B < E_S/P \tag{1}$$

wherein $E_S$ (mJ) is the optical energy per pulse of pulse-like light incident on each optical member comprising the illumination optical system, $A_B$ (cm$^2$) is the cross-sectional area of the luminous flux transmitted through each optical member in the illumination optical system, and P (mJ/cm$^2$) is the energy per unit area. Here, a preferable value of P is 25 mJ/cm$^2$. Consequently, it becomes possible to eliminate the problem of there being a position where the luminous flux diameter becomes smaller thereby increasing the energy density at this position so as to cause a damage to the optical member comprising the illumination optical system. Thus, an apparatus which is excellent in durability can be secured.

While the above-mentioned condition (1) is desirably satisfied in order for the illumination optical system of the exposure apparatus to have a durability, the durability of the whole illumination system can be further improved when not only the optical member at the position satisfying the above-mentioned condition (1) but also optical members at other positions are comprised of fluorite so that the whole illumination system is comprised of fluorite.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

FIG. 1A is a configurational view showing the exposure apparatus in accordance with an embodiment of the present invention observed from vertically thereabove;

FIG. 1B is a configurational view showing the exposure apparatus in accordance with the embodiment of the present invention observed from a lateral direction;

FIG. 2A is a schematic view showing a first multiple light source image forming means shown in FIGS. 1A and 1B;

FIG. 2B is a schematic view showing a second multiple light source image forming means shown in FIGS. 1A and 1B;

DETAILED DESCRIPTION OF THE PREFERRED EMBODIMENTS

Figure 3A:
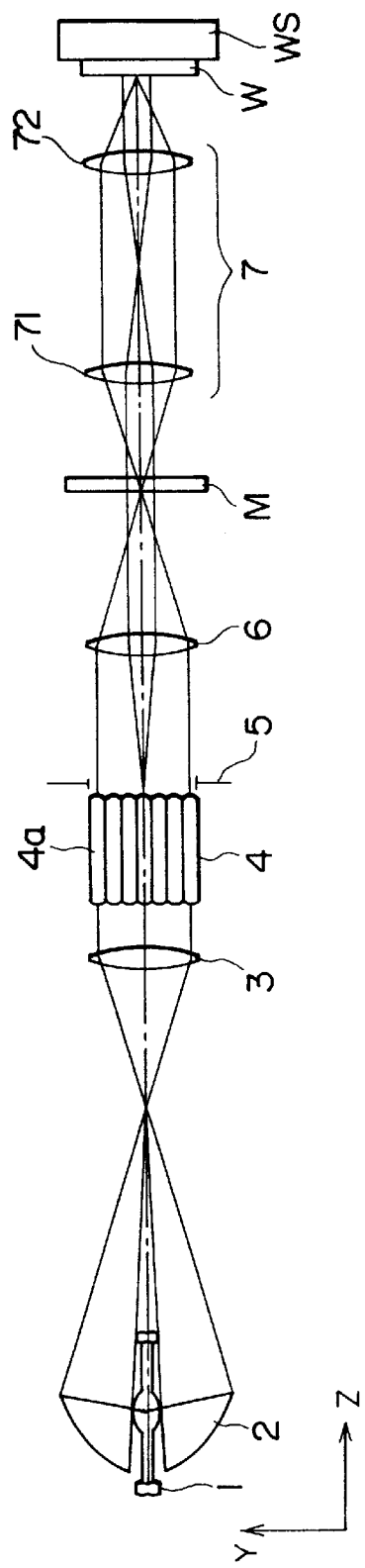
FIG. 3A is a configurational view showing a conventional exposure apparatus.
Figure 3C:
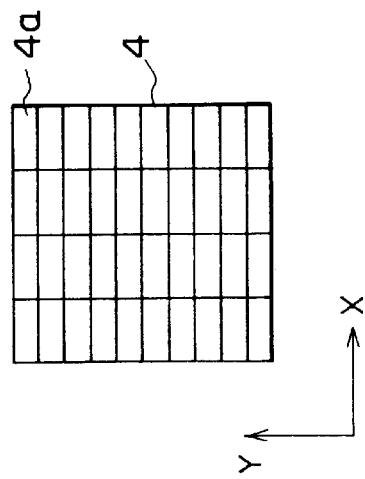
FIGS. 3B and 3C are schematic views showing a flyeye lens shown in FIG. 3A.
Figure 3B:
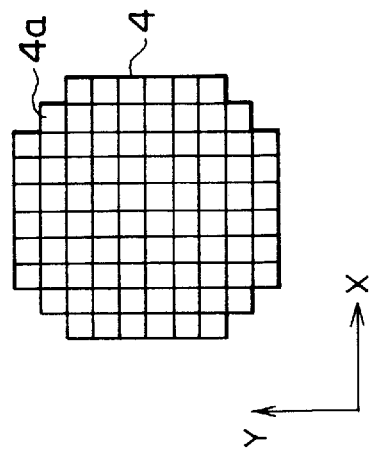

FIGS. 1A and 1B show configurations of the exposure apparatus for manufacturing semiconductors in accordance with an embodiment of the present invention. FIG. 1A is a view showing the configuration of the apparatus in accordance with this embodiment observed from vertically thereabove, whereas FIG. 1B shows a cross-sectional configuration of the apparatus shown in FIG. 1A observed from a lateral direction. In the following, this embodiment will be explained in detail with reference to FIGS. 1A and 1B.

As shown in FIGS. 1A and 1B, from a light source 10 such as an excimer laser supplying light with a predetermined wavelength, a substantially parallel luminous flux having such a wavelength as 222 nm (KrCl), 248 nm (KrF), 192 nm (ArF), or 157 nm ($F_2$) is output with a rectangular cross section. This parallel luminous flux from the light source 10 is made incident on a beam shaping optical system 20 of a light guiding optical system that also includes a relay optical system 21. The beam shaping optical system 20 functions as a luminous flux shaping section for shaping the input luminous flux into a luminous flux having a predetermined cross section. This beam shaping optical system 20 is composed of two cylindrical lenses 20A and 20B each of which has a refractive power in a direction perpendicular to the paper surface of FIG. 1A (i.e., in the paper surface direction of FIG. 1B). The cylindrical lens 20A on the light source side has a negative refractive power so as to cause the luminous flux in the paper surface direction of FIG. 1B to diverge, whereas the cylindrical lens 20B on the illuminated surface side has a positive refractive power so as to converge the divergent luminous flux from the cylindrical lens 20A into a parallel luminous flux. Accordingly, by way of the beam shaping optical system 20, the parallel luminous flux from the light source 10 is shaped such that its width in the paper surface direction of FIG. 1B is enlarged so as to render a rectangular cross section with a predetermined size. As the beam shaping optical system 20, a combination of cylindrical lenses each having a positive refractive power, an anamorphic prism, or the like may also be used.

Thus shaped luminous flux from the beam shaping optical system 20 is made incident on the relay optical system 21 of the light guiding optical system, which may also be referred to as the first relay optical system of the exposure apparatus. Here, the first relay optical system 21 has a front group with a positive refractive power composed of two positive lenses 21A and 21B and a rear group with a positive refractive power composed of two positive lenses 21C and 21D. The front group comprising the lenses 21A and 21B of the first relay optical system 21 forms a convergence point (light source image) I at the mask side (rear-side) focal point of this front group, whereas the rear group comprising the lenses 21C and 21D of the first relay optical system 21 is disposed such that its light source side (front-side) focal point coincides with the rear-side focal point of the front group. Also, this first relay optical system 21 has a function to make the exit surface of the light source 10 conjugate with the inlet surface of an optical integrator 30 acting as a first multiple light source forming subsystem of a multiple light source forming system, which will be explained later. Due to this function of the first relay optical system 21, the fluctuation of the luminous flux illuminating the optical integrator 30 caused by an angular fluctuation of the light from the light source 10 is corrected, whereby the tolerance with respect to the angular fluctuation in the light from the light source 10 is increased. Here, a light-guiding optical system for guiding the light from the light source 10 to the first multiple light source forming subsystem in this embodiment is constituted by the beam shaping optical system 20 and the first relay optical system 21.

By way of the first relay optical system 21, the luminous flux is made incident on the optical integrator 30 which acts as a first multiple light source forming subsystem of a multiple light source forming system for forming a plurality of light source images linearly arranged in three rows. As shown in FIG. 2A, this optical integrator 30 is comprised of a plurality (3 rows×9 columns=27 pieces) of biconvex lens elements 30a each having a substantially square form, whereby the optical integrator 30 as a whole has a rectangular cross section. In each of the biconvex lens element 30a, the curvature (refractive power) in the paper surface direction of FIG. 1A and that in the paper surface direction of FIG. 1B are equal to each other.

Accordingly, the parallel luminous flux passing through each lens element 30a comprising the optical integrator 30 is converged so as to form a light source image on the exit side of the corresponding lens element 30a. Consequently, at an exit-surface position $A_1$ of the optical integrator 30, a plurality (3 rows×9 columns=27 pieces) of light source images corresponding to the number of the lens elements 30a are formed, whereby secondary light sources are substantially formed here.

The luminous fluxes from the plurality of secondary light sources formed by the optical integrator 30 are converged by a second relay optical system 40 of the multiple light source forming system that may also be referred to as a second relay optical system of the exposure apparatus, and then made incident on an optical integrator 50 which acts as a second multiple light source forming subsystem of a multiple light source forming system for forming a plurality of light source images.

As shown in FIG. 2B, this optical integrator 50 is comprised of a plurality (9 rows×3 columns=27 pieces) of biconvex lens elements 50a each having a rectangular form whose cross-sectional form (aspect ratio) is similar to that of the optical integrator 30. The optical integrator 50 as a whole has a square cross section. In each of the lens element 50a, the curvature (refractive power) in the paper surface direction of FIG. 1A and that in the paper surface direction of FIG. 1B equal to each other.

Accordingly, the parallel luminous flux from the optical integrator 30 passing through each lens element 50a comprising the optical integrator 50 is converged so as to form a light source image on the exit side of the corresponding lens element 50a. Consequently, at an exit-surface position $A_2$ of the optical integrator 50, a plurality of light source images arranged in a square are formed, whereby tertiary light sources are substantially formed here.

Here, assuming that the number of the lens elements 30a comprising the optical integrator 30 is N and that the number of the lens elements 50a comprising the optical integrator 50 is M, N×M pieces of light source images arranged in a square are formed by the optical integrator 50. Namely, since the plurality of light source images formed by the optical integrator 30 are formed at the light-source image position of each lens element 50a comprising the optical integrator 50 by means of the relay optical system 40, N×M pieces of light source images in total are formed at the exit-surface position $A_2$ of the optical integrator 50.

Here, the second relay optical system 40 makes an inlet-surface position $B_1$ of the optical integrator 30 and an inlet-surface position $B_2$ of the optical integrator 50 conjugate with each other, while making the exit-surface position $A_1$ of the optical integrator 30 and the exit-surface position $A_2$ of the optical integrator 50 conjugate with each other.

At or near the position $A_2$ where the tertiary light sources are formed, an aperture stop AS having an opening with a predetermined form is disposed. The luminous fluxes from the tertiary light sources, which are shaped into a circular form by this aperture stop AS, are converged by a condenser optical system 60 acting as a convergent optical system so as to uniformly illuminate a mask M, which is an object to be illuminated, in a slit-like form (rectangular form having a long side and a short side) from thereabove.

The mask M is held by a mask stage MS, whereas a wafer w is held by a wafer stage WS. The mask M held by the mask stage MS and the wafer W mounted on the wafer stage WS are disposed so as to be conjugate with each other with respect to a projection optical system PL, whereby a pattern such as a circuit pattern portion of the mask M illuminated like a slit is projected onto the wafer w by the projection optical system PL.

In an actual exposure operation according to the foregoing configuration, the mask stage MS and the wafer W are moved in respective directions opposite to each other as indicated by arrows in FIG. 1B, whereby the circuit pattern on the mask M is transferred onto the wafer W.

In the following, the lens configuration in the illumination optical system in accordance with this embodiment will be explained in detail.

In the embodiment shown in FIGS. 1A and 1B, the position at which the energy density becomes considerably high when the luminous flux from the light source 10 such as an excimer laser is projected within the first relay optical system 21. It is due to the fact that, as the energy density is inversely proportional to the cross-sectional area of the luminous flux, the energy density becomes higher at a lens element on which light having a smaller luminous flux diameter is incident. Accordingly, since the convergence point (light source image) I for the whole luminous flux from the light source 10 is formed in the optical path between the front group (composed of the lenses 21A and 21B) and the rear group (composed of the lenses 21C and 21D) in the first relay optical system 21, the energy density becomes considerably high at the positive lens 21B in the front group and the positive lens 21C in the rear group where the cross-sectional area of the luminous flux is smaller.

In an example for explaining this embodiment in terms of specific values, the light source 10 supplies output light having an optical cross-sectional area of 1.25 cm$^2$ and an optical energy per pulse $E_S$ of 10 mJ, the beam shaping optical system 20 has an enlarging magnification of 1.6, and each of the front group (composed of the lenses 21A and 21B) and rear group (composed of the lenses 21C and 21D) in the first relay optical system 21 has a focal length of 100 mm such that the first relay optical system 21 is formed by a same-magnification system. Also, the positive lens 21B is disposed at a position which is displaced on the light source side by 43.6 mm from the position of the light source image I formed by the front group, whereas the positive lens 21C is disposed at a position which is displaced on the mask side by 43.6 mm from the position of the light source image I formed by the front group. In this case, the cross-sectional area of the luminous flux transmitted through the beam shaping optical system 20 is 2.0 cm$^2$, the luminous flux passing through the positive lens 21B has a cross-sectional area $A_{B1}$ of 0.38 cm$_2$, and the luminous flux passing through the positive lens 21C has a cross-sectional area $A_{B2}$ of 0.38 cm$_2$. Here, since there is no substantial loss in optical quantity of the light from the light source 10 passing through the beam shaping optical system 20 and first relay optical system 21, the optical energy $E_S$ is 10 mJ when the light is incident on any of the positive lenses 21B and 21C. Accordingly, from the above-mentioned example of values, it can be understood that both the positive lens 21B in the front group and the positive lens 21C in the rear group in the first relay optical system 21 satisfy the above-mentioned condition (1). Thus, as the positive lenses 21B and 21C which yield the cross-sectional area of the luminous flux satisfying the above-mentioned condition (1) are comprised of fluorite, this embodiment realizes a configuration which is excellent in durability.

While the positive lens 21B in the front group and the positive lens 21C in the rear group in the first relay optical system 21 are comprised of fluorite in this embodiment, the first relay optical system 21 may be comprised of a larger number of lenses in order to attain more sufficient correction of aberration. In this case, due to spatial restriction, a plurality of lenses must be disposed near the convergence point I at which the energy density becomes high. Accordingly, all the lenses positioned near this convergence point I are comprised of fluorite.

Thus, in FIG. 1A where the energy density is considerably high, while the positive lens 21B in the front group and the positive lens 21C in the rear group in the first relay optical system 21 are comprised of fluorite, it is needless to mention that all the optical members such as lens at positions satisfying the above-mentioned condition (1) are preferably comprised of fluorite.

Also, not only the first relay optical system 21 but also other high-energy portions such as optical integrators 30 and 50 preferably use fluorite. Further, in the case where an excimer laser which oscillates light with a higher output is used as the light source 10, the durability of the apparatus can be increased when the whole illumination system is comprised of fluorite.

Though the foregoing embodiment shows an example in which a part of lenses constituting the first relay optical system 21 is comprised of fluorite, lenses constituting the optical integrator 4 and condenser optical system 6 of the illumination optical system shown in FIG. 3A equipped with neither the beam shaping optical system 20 nor the first relay optical system 21 may be comprised of fluorite. Also in this case, the above-mentioned condition (1) is preferably satisfied. In this case, since the respective luminous fluxes incident on the optical integrator 4 and the condenser optical system 6 may lose their optical quantity due to eclipse or the like, the optical energy $E_S$ in the above-mentioned condition (1) should represent the respective optical energies incident on the optical integrator 4 and the condenser optical system 6.

While the foregoing embodiment shows an example of a step scan type exposure apparatus, the durability of the illumination system in a collective exposure type exposure apparatus can also be improved when fluorite is used at a portion where the energy density is high. Further, the present invention can be similarly applied to a scanning type projection optical system. U.S. patent application Ser. No. 08/453,538 (Tanaka et al.) is incorporated herein by reference for disclosing such an exposure apparatus.

Also, though the above-mentioned embodiment uses an excimer laser as the light source 10, a light source in which a higher harmonic wave is used in conjunction with a solid-state laser to yield a wavelength of 250 nm or shorter, for example, may also be employed as the light source.

As explained in the foregoing, the present invention can realize an exposure apparatus which is excellent in durability and capable of preventing optical members in its illumination optical system from deteriorating even when irradiating a mask with high-output exposure light for a long period, so that a stable exposure operation can be realized over a long period. Also, even when a light source having a higher output is used, it is possible to realize an exposure operation which can maintain a high throughput while preventing the optical members in the illumination optical system of the exposure apparatus from deteriorating.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application No. 157812/1995 filed on Jun. 23, 1995 is hereby incorporated by reference.

What is claimed is:

1. An exposure apparatus comprising:
    a light source for supplying light having a predetermined wavelength; and
    an illumination optical system disposed in a light path formed by said light source for guiding light from said light source onto a mask formed with a predetermined pattern to expose said pattern of the mask onto a photosensitive substrate, said illumination optical system including a plurality of light-transmitting optical members which transmit therethrough the light from said light source, at least one of the plurality of light-transmitting optical members being comprised of fluorite, said at least one light-transmitting optical member being located near a convergence point of the illumination optical system.

2. An exposure apparatus according to claim 1, wherein said light source is a pulsed light source and said at least one light-transmitting optical member comprised of fluorite is disposed at a position where the relationship $$A_B < E_S/P$$

is satisfied, wherein $E_S$ (mJ) is the optical energy per pulse incident on said light-transmitting optical member comprised of fluorite, $A_B$ (cm$^2$) is the cross-sectional area of a luminous flux transmitted through said light-transmitting optical member comprised of fluorite, and P (mJ/cm$^2$) is energy per unit area.

3. An exposure apparatus according to claim 2, further comprising a projection optical system disposed between said mask and said photosensitive substrate for projecting the pattern of said mask onto said photosensitive substrate.

4. An exposure apparatus according to claim 2, wherein said illumination optical system comprises:
    a multiple light source forming system disposed at a predetermined position for receiving light from said light source and for forming a plurality of light sources using light from said light source; and
    a condenser optical system disposed between said multiple light source forming system and said mask for converging respective light components from the plurality of light sources formed by said multiple light source forming system so as to illuminate said mask in a superposing manner.

5. An exposure apparatus according to claim 4, wherein said multiple light source forming system comprises a first multiple light source forming subsystem for receiving light from said light guiding optical system, a relay optical system for receiving light from said first relay optical system, and a second multiple light source forming subsystem for receiving light from said relay optical system.

6. An exposure apparatus according to claim 4, wherein said illumination optical system further comprises a light-guiding optical system disposed between said light source and said multiple light source forming system for guiding the light from said light source to said multiple light source.

7. An exposure apparatus according to claim 1, further comprising a projection optical system disposed between said mask and said photosensitive substrate for projecting the pattern of said mask onto said photosensitive substrate.

8. An exposure apparatus according to claim 7, wherein said illumination optical system further comprises:
   a multiple light source forming system disposed at a predetermined position for receiving light from said light source and forming a plurality of light source based on the light from said light source; and
   a condenser optical system disposed between said multiple light source forming system and said mask for converging respective light components from the plurality of light sources formed by said multiple light source forming system to illuminate said mask in a superposing manner.

9. An exposure apparatus according to claim 8, wherein said illumination optical system further comprises a light-guiding optical system disposed between said light source and said multiple light source forming system for guiding light from said light source system to said multiple light source forming system.

10. An exposure apparatus according to claim 9, wherein said multiple light source forming system comprises a first multiple light source forming subsystem for receiving light from said light guiding optical system, a relay optical system for receiving light from said relay optical system, and a second multiple light source forming subsystem for receiving light from said relay optical system.

11. An exposure apparatus comprising:
   a light source system for supplying light having a predetermined wavelength; and
   an illumination optical system disposed in a light path of said light source system for guiding light from said light source system onto a mask to expose a pattern of the mask onto a photosensitive substrate, said illumination optical system comprising:
   a multiple light source forming system disposed at a predetermined position to receive light from said light source system for forming a plurality of light sources from the light from said light source system;
   a condenser optical system disposed between said multiple light source forming system and said mask for converging respective light components from the plurality of light sources formed by said multiple light source forming system to illuminate said mask in a superposing manner; and
   a light-guiding optical system disposed between said light source system and said multiple light source forming system for guiding light from said light source system to said multiple light source, said light-guiding optical system including a plurality of light-transmitting optical members for transmitting light from said light source system therethrough, at least one of said plurality of light-transmitting optical members being comprised of fluorite.

12. An exposure apparatus according to claim 11, further comprising a projection optical system disposed between said mask and said photosensitive substrate for projecting the pattern of said mask onto said photosensitive substrate.

13. An exposure apparatus according to claim 11, wherein said light source system is a pulsed light source system and said at least one light transmitting optical member comprised of fluorite is disposed at a position where the relationship $$A_B < E_S/P$$

is satisfied, wherein $E_S$ (mJ) is the optical energy per pulse incident oh said light-transmitting optical member comprised of fluorite, $A_B$ (cm$^2$) is the cross-sectional area of a luminous flux transmitted through said light-transmitting optical member comprised of fluorite, and P (mJ/cm$^2$) is energy per unit area.

14. An exposure apparatus according to claim 13, further comprising a projection optical system disposed between said mask and said photosensitive substrate for projecting the pattern of said mask onto said photosensitive substrate.

15. An exposure apparatus according to claim 14, wherein said value P is not less than 25 mJ/cm$^2$.

16. an exposure apparatus according to claim 11, wherein said at least one light-transmitting optical member is located near a convergence point of the illumination optical system.

17. an exposure apparatus according to claim 16, wherein said light source system is a pulsed light source system, and wherein said at least one light-transmitting optical member comprised of fluorite is disposed at a position where the relationship $$A_B < E_S/P$$

is satisfied, wherein $E_S$ (mJ) is the optical energy per pulse incident on said light-transmitting optical member comprised of fluorite, $A_B$ (cm$^2$) is the cross-sectional area of a luminous flux transmitted through said light-transmitting optical member comprised of fluorite, and P (mJ/cm$^2$) is energy per unit area.

18. An exposure apparatus according to claim 17, further comprising a projection optical system disposed between said mask and said photosensitive substrate for projecting the pattern of said mask onto said photosensitive substrate.

19. An exposure apparatus according to claim 18, wherein said value P is not less than 25 mJ/cm$^2$.

20. An exposure apparatus, comprising:
   a light source for supplying light having a predetermined wavelength; and
   an illumination optical system for guiding light from said light source onto a mask to expose a pattern of the mask onto a photosensitive substrate, said illumination optical system including a plurality of light-transmitting optical members for transmitting therethrough light from said light source, at least one of said plurality of light-transmitting optical members being comprised of fluorite, wherein said light source is a pulsed light source and said at least one light-transmitting optical member comprised of fluorite is disposed at a position where the relationship $$A_B < E_S/P$$

is satisfied, wherein $E_S$ (mJ) is the optical energy per pulse incident on said light-transmitting optical member comprised of fluorite, $A_B$ (cm$^2$) is the cross-sectional area of a luminous flux transmitted through said light-transmitting optical member comprised of fluorite, and P (mJ/cm$^2$) is energy per unit area.

21. An exposure apparatus according to claim 20, further comprising a projection optical system disposed between said mask and said photosensitive substrate for projecting the pattern of said mask onto said photosensitive substrate.

22. An exposure apparatus according to claim 21, wherein said value P is not less than 25 mJ/cm$^2$.

23. A method of manufacturing a semiconductor structure, comprising the steps of:

(1) providing an exposure apparatus, comprising the steps of:

providing a light source for supplying light having a predetermined wavelength; and providing an illumination optical system for guiding light from said light source onto a mask to expose a pattern of the mask onto a photosensitive substrate, said illumination optical system including a plurality of light-transmitting optical member for transmitting there through light from said light source, at least one of said plurality of light-transmitting optical member being comprised of fluorite, said at least one of said plurality of light-transmitting optical members being located near a convergence point of the illumination optical system: and (2) exposing an image of the pattern of the mask onto the photosensitive substrate by illuminating said mask using the illumination optical system.

24. A method as recited in claim 23, wherein providing said exposure apparatus comprises the further step of providing a projection optical system between said mask and said photosensitive substrate for projecting a pattern of said mask onto said photosensitive substrate.

25. A method as recited in claim 24, wherein said light source is a pulsed light source and said at least one light-transmitting optical member comprised of fluorite is disposed at a position where the relationship $$A_B < E_S/P$$

is satisfied, wherein $E_S$ (mJ) is the optical energy per pulse incident on said light-transmitting optical member comprised of fluorite, $A_B$ (cm$^2$) is the cross-sectional area of a luminous flux transmitted through said light-transmitting optical member comprised of fluorite, and P (mJ/cm$^2$) is energy per unit area.

26. An exposure apparatus according to claim 25, wherein said value P is not less than 25 mJ/cm$^2$.

27. A method as recited in claim 23, wherein said provided illumination optical system further comprises:

multiple light source forming system for forming a plurality of light sources using light from said light source and a condenser optical system for converging respective light components from a plurality of light sources formed by said multiple light source forming system so as to illuminate said mask in a superposing manner; and a light-guiding optical system for guiding the light from said light source to said multiple light source forming system.

28. A method as recited in claim 27, wherein said provided light-transmitting optical member comprised of fluorite is provided near a convergence point of said light.

29. A method as recited in claim 28, wherein said provided exposure apparatus further comprises a projection optical system disposed between said mask and said photosensitive substrate for projecting the pattern of said mask onto said photosensitive substrate.

30. A method as recited in claim 29, wherein said light source is a pulsed light source and said at least one light-transmitting optical member comprised of fluorite is disposed at a position where the relationship $$A_b < E_S/P$$

is satisfied, wherein $E_S$ (mJ) is the optical energy per pulse incident on said light-transmitting optical member comprised of fluorite, $A_B$ (cm$^2$) is the cross-sectional area of a luminous flux transmitted through said light-transmitting optical member comprised of fluorite, and P (mJ/cm$^2$) is energy per unit area.

31. A method as recited in claim 30, wherein said value P is not less than 25 mJ/cm$^2$.

32. A method as recited in claim 27, wherein said provided exposure apparatus further comprises a projection optical system disposed between said mask and said photosensitive substrate for projecting the pattern of said mask onto said photosensitive substrate.

33. A method as recited in claim 32, wherein said light source is a pulsed light source and said at least one light-transmitting optical member comprised of fluorite is disposed at a position where the relationship $$A_B < E_S/P$$

is satisfied, wherein $E_S$ (mJ) is the optical energy per pulse incident on said light-transmitting optical member comprised of fluorite, $A_B$ (cm$^2$) is the cross-sectional area of a luminous flux transmitted through said light-transmitting (optical member comprised of fluorite, and P (mJ/cm$^2$) is energy per unit area.

34. A method as recited in claim 33, wherein said value P is not less than 25 mJ/cm$^2$.

35. A method as recited in claim 32, wherein said multiple light source forming system comprises a first multiple light source forming subsystem for receiving light from said light guiding optical system, a relay optical system for receiving light from said relay optical system, and a second multiple light source forming subsystem for receiving light from said relay optical system.

36. A method as recited in claim 23, wherein said provided light source is a pulsed light source.

37. A method as recited in claim 23, wherein providing said exposure apparatus further comprises providing a projection optical system between said mask and said photosensitive substrate for projecting a pattern of said mask onto said photosensitive substrate, and wherein said exposing comprises relatively moving said mask and said photosensitive substrate.

38. A method as recited in claim 37, wherein said provided light-transmitting optical member comprised of fluorite is provided near a convergence point of said light.

39. A method as recited in claim 38, wherein said light source is a pulsed light source and said at least one light-transmitting optical member comprised of fluorite is disposed at a position where the relationship $$A_B < E_S/P$$

is satisfied, wherein $E_S$ (mJ) is the optical energy per pulse incident on said light-transmitting optical member comprised of fluorite, $A_B$ (cm$^2$) is the cross-sectional area of a luminous flux transmitted through said light-transmitting optical member comprised of fluorite, and P (mJ/cm$^2$) is energy per unit area.

40. A method as recited in claim 39, wherein said value P is not less than 25 mJ/cm$^2$.

41. A method as recited in claim 38, wherein said provided illumination optical system further comprises multiple light source forming system for forming a plurality of light sources using light from said light source and a condenser optical system for converging respective light components from the plurality of light sources formed by the multiple light source forming system so as to illuminate said mask in a superposing manner.

42. A method as recited in claim 41, wherein said light source is a pulsed light source and said at least one light-transmitting optical member comprised of fluorite is disposed at a position where the relationship $$A_B < E_S/P$$

is satisfied, wherein $E_S$ (mJ) is the optical energy per pulse incident on said light-transmitting optical member comprised of fluorite, $A_B$ (cm$^2$) is the cross-sectional area of a luminous flux transmitted through said light-transmitting optical member comprised of fluorite, and P (mJ/cm$^2$) is energy per unit area.

43. A method as recited in claim 42, wherein said value P is not less than 25 mJ/cm$^2$.

44. A method as recited in claim 41, wherein said multiple light source forming system comprises a first multiple light source forming subsystem for receiving light from said light guiding optical system, a relay optical system for receiving light from said relay optical system, and a second multiple light source forming subsystem for receiving light from said relay optical system.

45. A method as recited in claim 37, wherein said provided illumination optical system further comprises multiple light source forming system for forming a plurality of light sources using light from said light source and a condenser optical system for converging respective light components from the plurality of light sources formed by the multiple light source forming system so as to illuminate said mask in a superposing manner, and wherein said provided illumination optical system further comprises a light-guiding optical system for guiding light from said light source to said multiple light source forming system.

46. A method as recited in claim 45, wherein said light source is a pulsed light source and said at least one light-transmitting optical member comprised of fluorite is disposed at a position where the relationship $$A_B < E_S/P$$

is satisfied, wherein $E_S$ (mJ) is the optical energy per pulse incident on said light-transmitting optical member comprised of fluorite, $A_B$ (cm$^2$) is the cross-sectional area of a luminous flux transmitted through said light-transmitting optical member comprised of fluorite, and P (mJ/cm$^2$) is energy per unit area.

47. A method as recited in claim 46, wherein said value P is not less than 25 mJ/cm$^2$.

48. A method as recited in claim 35, wherein said multiple light source forming system comprises a first multiple light source forming subsystem for receiving light from said light guiding optical system, a relay optical system for receiving light from said relay optical system, and a second multiple light source forming subsystem for receiving light from said relay optical system.

49. An exposure apparatus according to claim 10, wherein said value P is not less than 25 mJ/cm$^2$.

50. An exposure apparatus according to claim 12, further comprising a projection optical system disposed between said mask and said photosensitive substrate for protecting the pattern of said mask onto said photosensitive substrate.

51. An exposure apparatus according to claim 38, wherein said value P is not less than 25 mJ/cm$^2$.

52. An illumination apparatus for guiding light to an object to be illuminated comprising:

a light source for supplying light having a predetermined wavelength;

a light-guiding optical system for receiving light from said light source;

a multiple light source forming system disposed at a predetermined position for receiving light from said light-guiding optical system and forming a plurality of light sources; and a condenser optical system disposed between said multiple light source forming system and said object for guiding light from said plurality of light sources to said object, wherein said light-guiding optical system, said multiple light source forming system and said condenser optical system include a plurality of light-transmitting optical members for transmitting therethrough light having said predetermined wavelength, at least one of said plurality of light-transmitting optical members being comprised of fluorite.

53. An illumination apparatus according to claim 52, wherein said at least one light-transmitting optical member comprised of fluorite is located near a convergence point of one of said light-guiding optical system, said multiple light source forming system and said condenser optical system.

54. An illumination apparatus according to claim 53, wherein said light source is a pulsed light source and said at least one light-transmitting optical member comprised of fluorite is disposed at a position where the relationship $$A_B < E_S/P$$

is satisfied, wherein $E_S$ (mJ) is the optical energy per pulse incident on said light-transmitting optical member comprised of fluorite, $A_B$ (cm$^2$) is the cross-sectional area of a luminous flux transmitted through said light-transmitting optical member comprised of fluorite, and P (mJ/cm$^2$) is energy per unit area.

55. An illumination apparatus according to claim 54, wherein said value P is not less than 25 mJ/cm$^2$.

56. An illumination apparatus according to claim 52, wherein said light source is a pulsed light source and said at least one light-transmitting optical member comprised of fluorite is disposed at a position where the relationship $$A_B < E_S/P$$

is satisfied, wherein $E_S$ (mJ) is the optical energy per pulse incident on said light-transmitting optical member comprised of fluorite, $A_B$ (cm$^2$) is the cross-sectional area of a luminous flux transmitted through said light-transmitting optical member comprised of fluorite, and P (mJ/cm$^2$) is energy per unit area.

57. An illumination apparatus according to claim 56, wherein said value P is not less than 25 mJ/cm$^2$.

58. An illumination apparatus according to claim 52, wherein said multiple light source forming system comprises a first multiple light source forming subsystem for receiving light from said light guiding optical system, a relay optical system for receiving light from said relay optical system, and a second multiple light source forming subsystem for receiving light from said relay optical system.

59. A method of manufacturing an illumination optical system for illuminating light having a predetermined wavelength to an object to be illuminated comprising:

calculating an energy density of luminous flux corresponding to a predetermined light-transmitting optical member within a plurality of light-transmitting optical members constituting said illumination optical system; and determining a material for said predetermined light-transmitting optical member in accordance with said energy density.

60. A method as recited in claim 59, wherein a determined material is fluorite.

61. A method as recited in claim 60, wherein said object to be illuminated is a mask having a pattern for exposure onto a photosensitive substrate.

62. A method as recited in claim 59, wherein said object to be illuminated is a mask having a pattern for exposure onto a photosensitive substrate.

* * * * *